United States Patent
Kwon et al.

(10) Patent No.: US 12,324,294 B2
(45) Date of Patent: Jun. 3, 2025

(54) LIGHT EMITTING DIODE DISPLAY DEVICE

(71) Applicant: LG DISPLAY CO., LTD., Seoul (KR)

(72) Inventors: Kyu Oh Kwon, Paju-si (KR); Joon Yeong Park, Paju-si (KR); Seung Jun Lee, Paju-si (KR); Jung Hun Choi, Paju-si (KR)

(73) Assignee: LG Display Co., Ltd, Seoul (KR)

( * ) Notice: Subject to any disclaimer, the term of this patent is extended or adjusted under 35 U.S.C. 154(b) by 543 days.

(21) Appl. No.: 17/787,177

(22) PCT Filed: Nov. 26, 2020

(86) PCT No.: PCT/KR2020/016889
§ 371 (c)(1),
(2) Date: Jun. 17, 2022

(87) PCT Pub. No.: WO2021/125606
PCT Pub. Date: Jun. 24, 2021

(65) Prior Publication Data
US 2023/0023304 A1    Jan. 26, 2023

(30) Foreign Application Priority Data

Dec. 20, 2019    (KR) .......................... 10-2019-0171544

(51) Int. Cl.
*H10H 29/32*    (2025.01)
*H01L 25/075*   (2006.01)
(Continued)

(52) U.S. Cl.
CPC ......... *H10H 29/32* (2025.01); *H01L 25/0753* (2013.01); *H10H 20/814* (2025.01);
(Continued)

(58) Field of Classification Search
None
See application file for complete search history.

(56) References Cited

U.S. PATENT DOCUMENTS

2004/0245531 A1* 12/2004 Fuii ................... H10K 50/11
                                                 257/88
2018/0294311 A1   10/2018 Hsiang et al.
(Continued)

FOREIGN PATENT DOCUMENTS

JP    2012-074752 A   4/2012
KR  10-2004-0014876 A  2/2004
(Continued)

OTHER PUBLICATIONS

Office Action issued in corresponding Korean Intellectual Property Application No. 10-2019-0171544, dated Apr. 25, 2024.
(Continued)

*Primary Examiner* — Feifei Yeung Lopez
(74) *Attorney, Agent, or Firm* — Morgan, Lewis & Bockius LLP

(57) ABSTRACT

In an LED display device according to an embodiment of the present disclosure, the LED display device comprises a second pixel driving circuit on a substrate, an LED element attached to a region not overlapping the second pixel driving circuit, including a first LED element, a second LED element and a growth substrate, and providing a double light-emitting spectrum, an element fixing layer surrounding the LED element, a first pixel driving circuit on the element fixing layer, and an element protecting layer on the first pixel driving circuit. In addition, the first LED element is controlled by the first pixel driving circuit, and the second LED element is controlled by the second pixel driving circuit. Therefore, the LED display device provides a dual emission spectrum, can realized high luminance and high definition, and can prevent a pixel defect.

16 Claims, 15 Drawing Sheets

(51) Int. Cl.
*H10H 20/814* (2025.01)
*H10H 20/831* (2025.01)
*H10H 20/857* (2025.01)
*H10H 29/30* (2025.01)
*H10H 29/34* (2025.01)
*H10H 29/49* (2025.01)
*H10H 29/80* (2025.01)

(52) U.S. Cl.
CPC ...... *H10H 20/8312* (2025.01); *H10H 20/857* (2025.01); *H10H 29/34* (2025.01); *H10H 29/352* (2025.01); *H10H 29/49* (2025.01); *H10H 29/8421* (2025.01)

(56) References Cited

U.S. PATENT DOCUMENTS

2019/0035773 A1  1/2019  Lo et al.
2021/0327976 A1  10/2021  Yang et al.

FOREIGN PATENT DOCUMENTS

KR  10-2019-0079258 A   7/2019
WO    2019-205547 A1   10/2019

OTHER PUBLICATIONS

International Search Report dated Mar. 4, 2021, issued in International Patent Application No. PCT/KR2020/016889.

\* cited by examiner

【Figure 1】
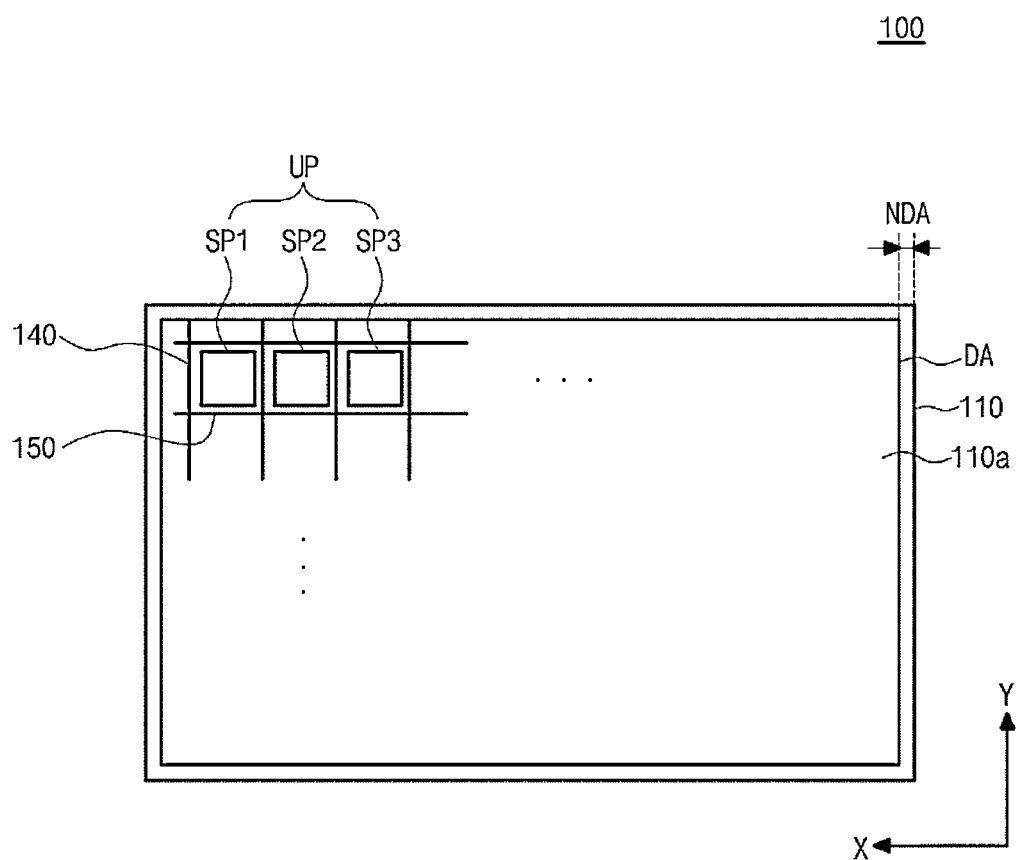

[Figure 2]
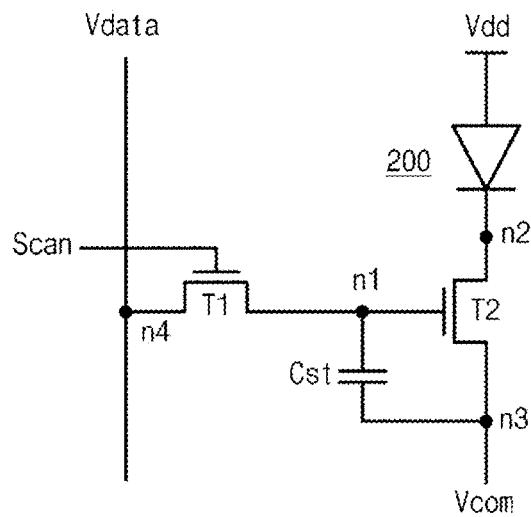
[Figure 3]
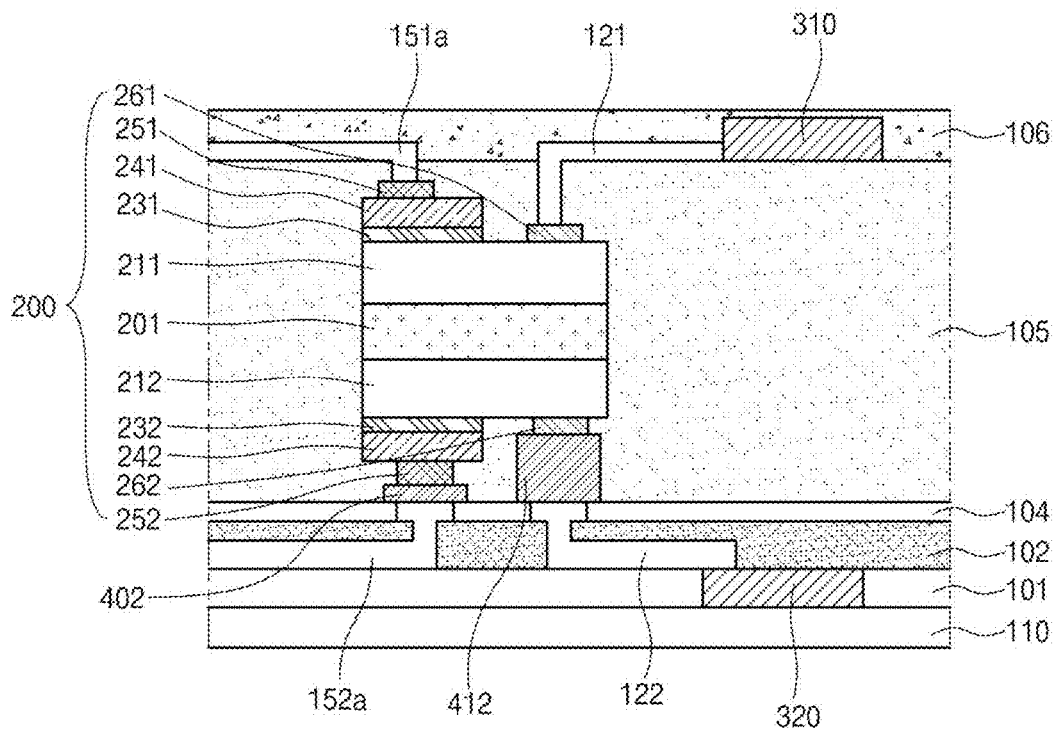

【Figure 4】
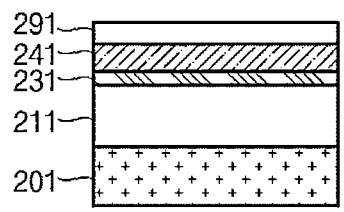
【Figure 5】
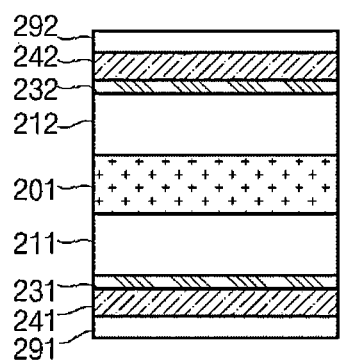
【Figure 6】
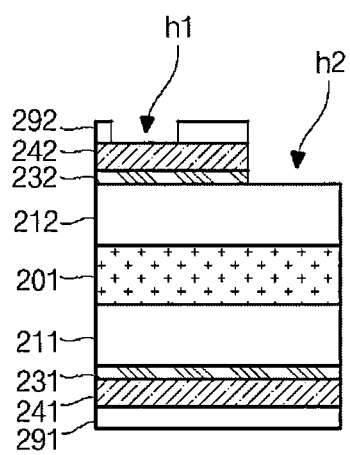

[Figure 7]
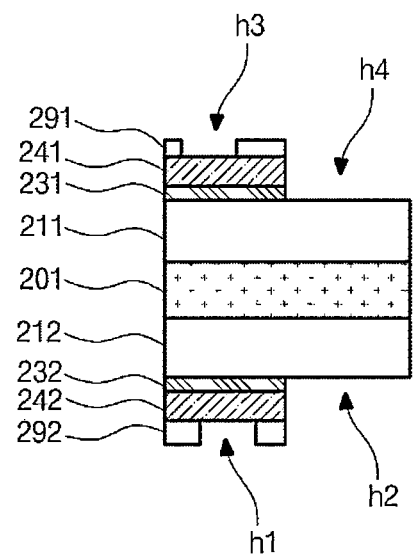
[Figure 8]
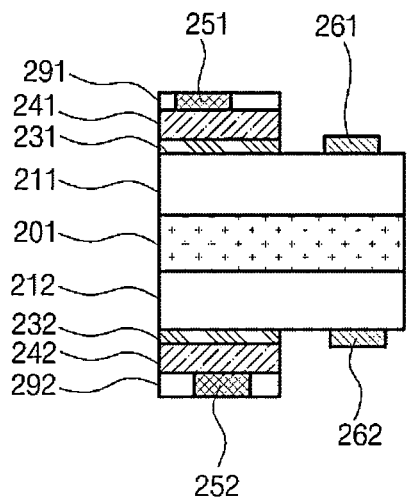

【Figure 9】
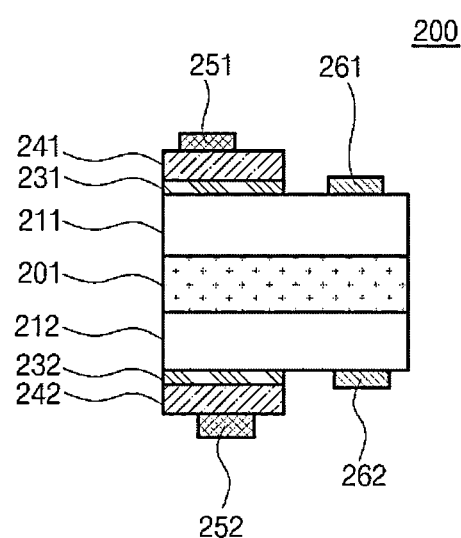
【Figure 10】
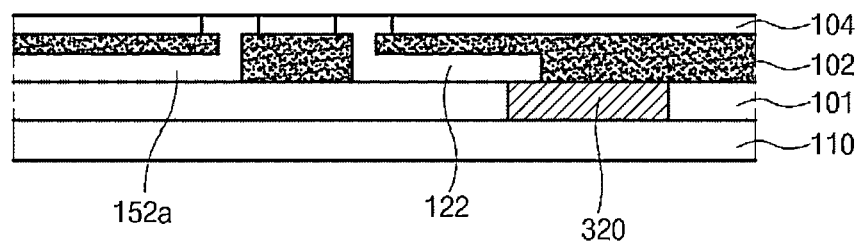

[Figure 11]
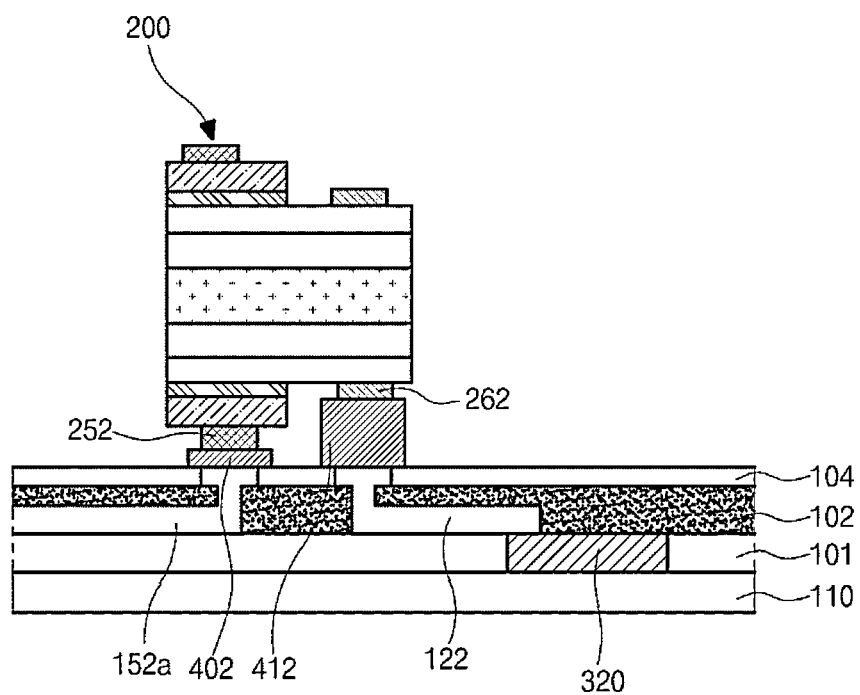

[Figure 12]
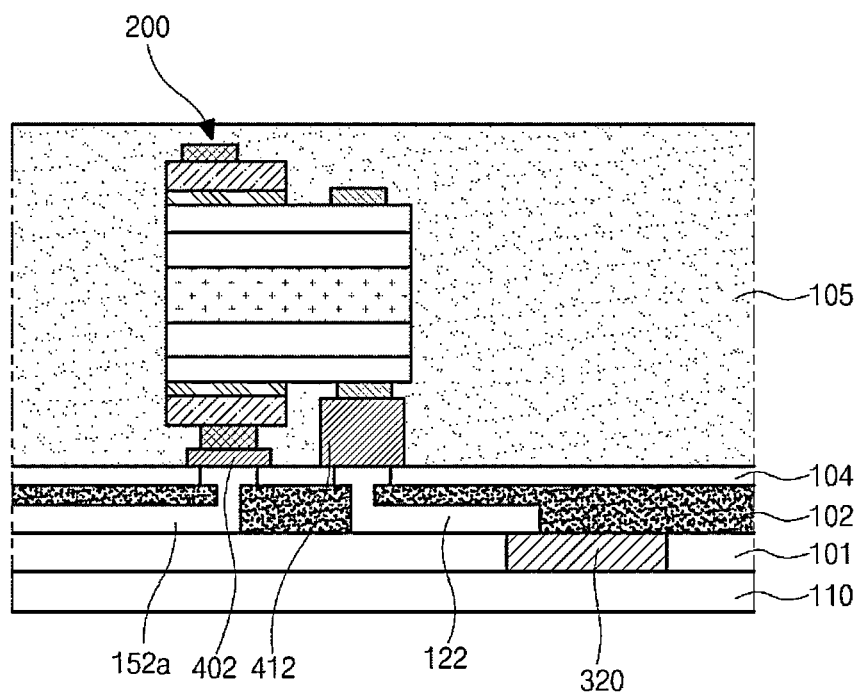

[Figure 13]
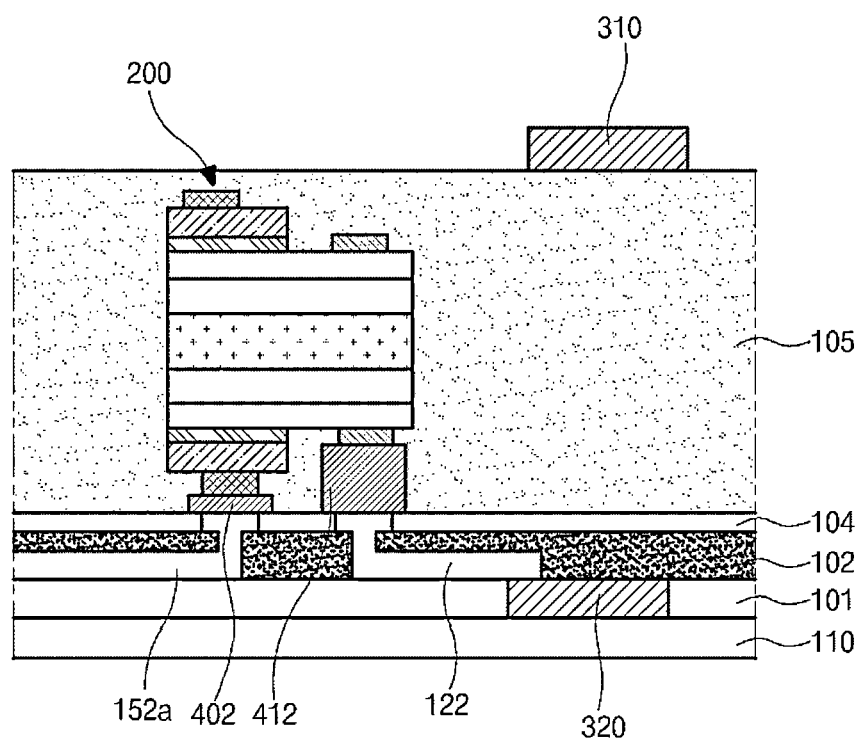

[Figure 14]
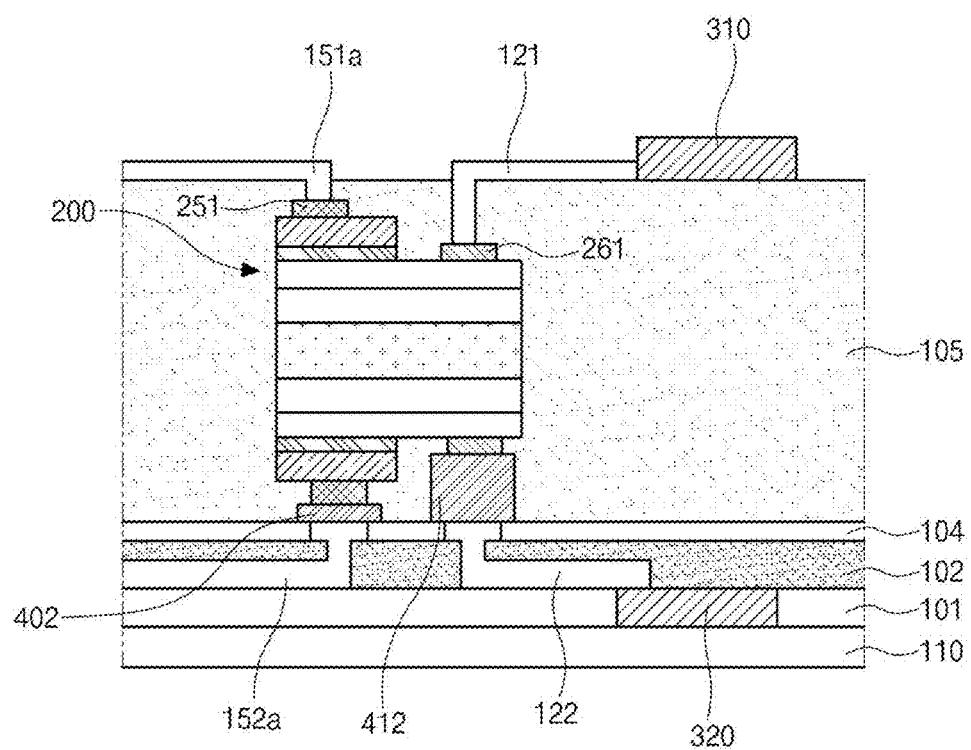

[Figure 15]
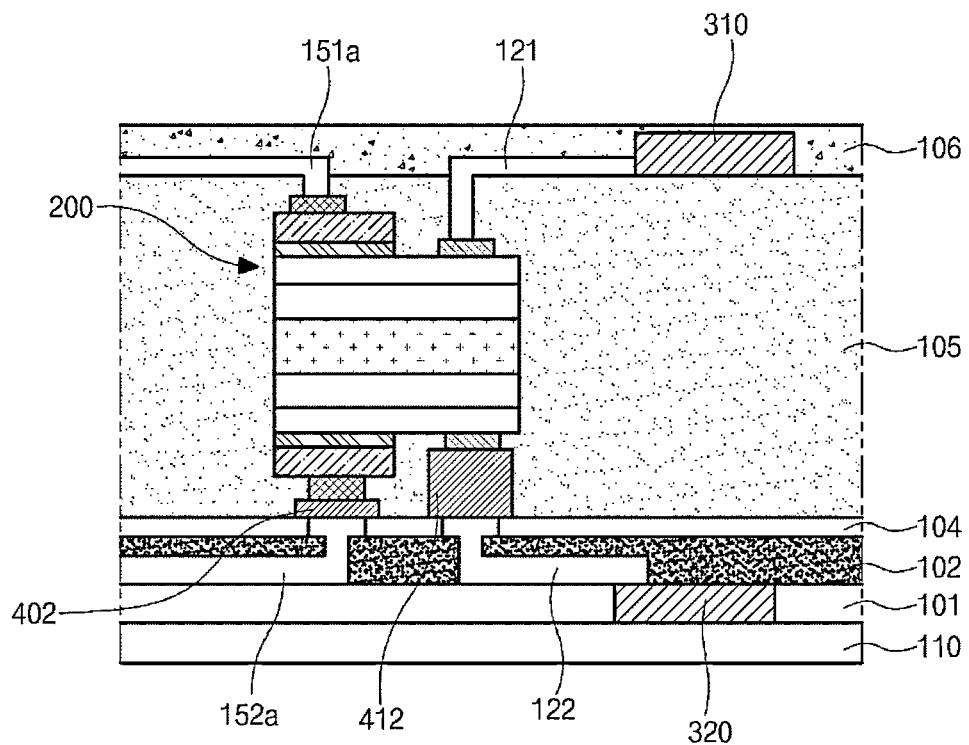

[Figure 16]
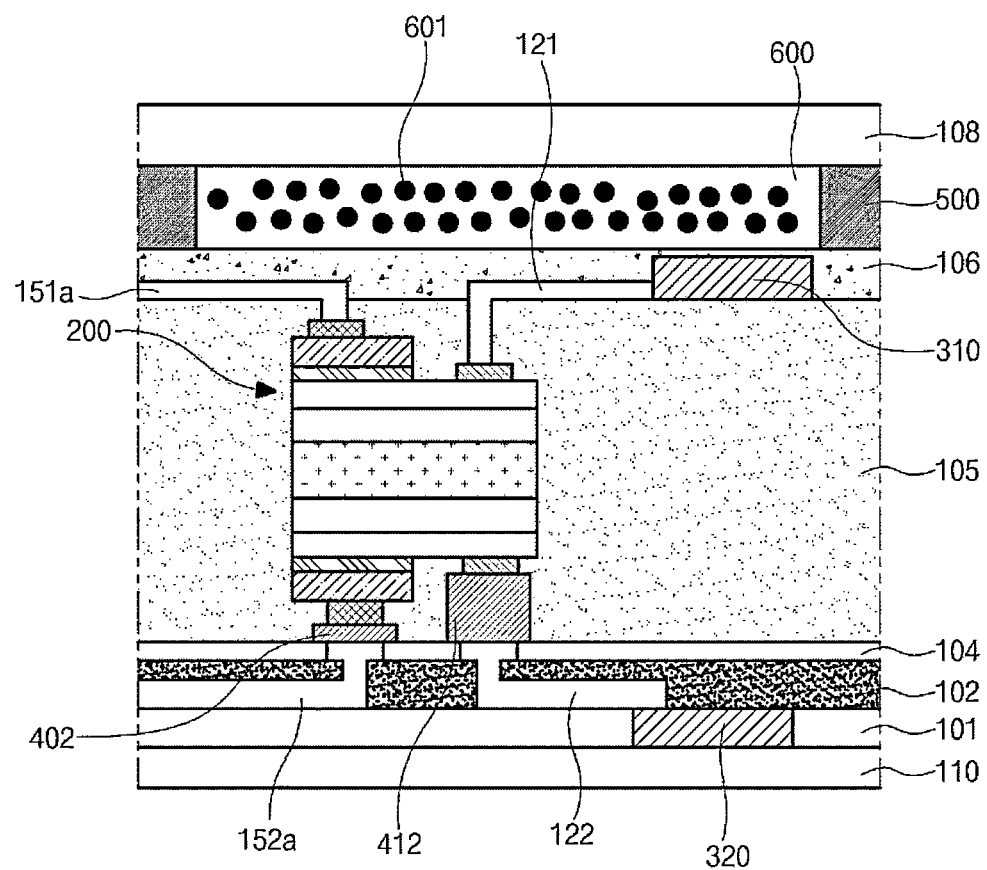

[Figure 17]
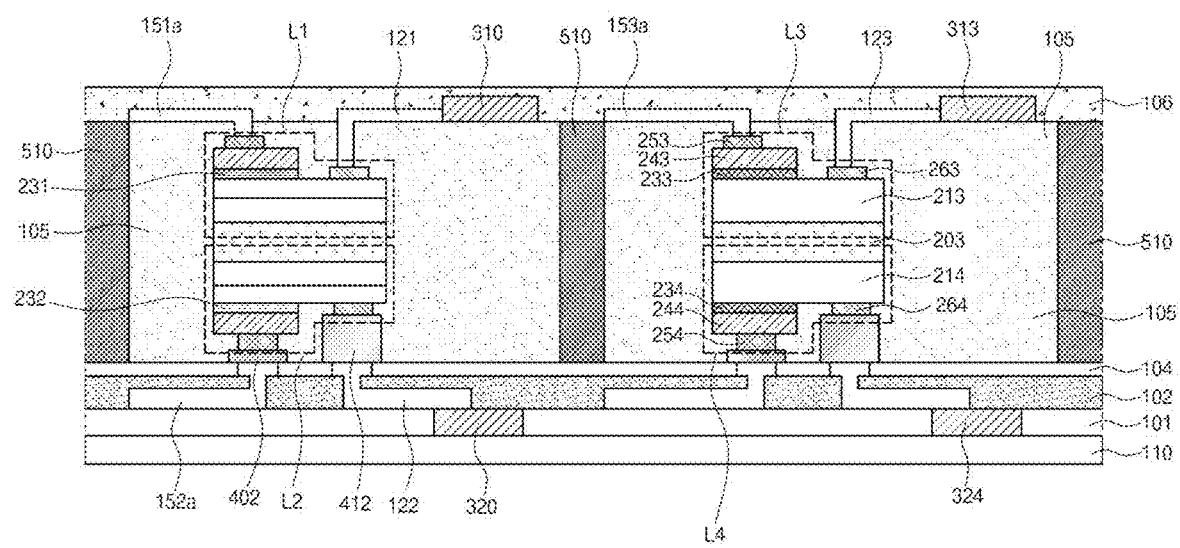

[Figure 18]
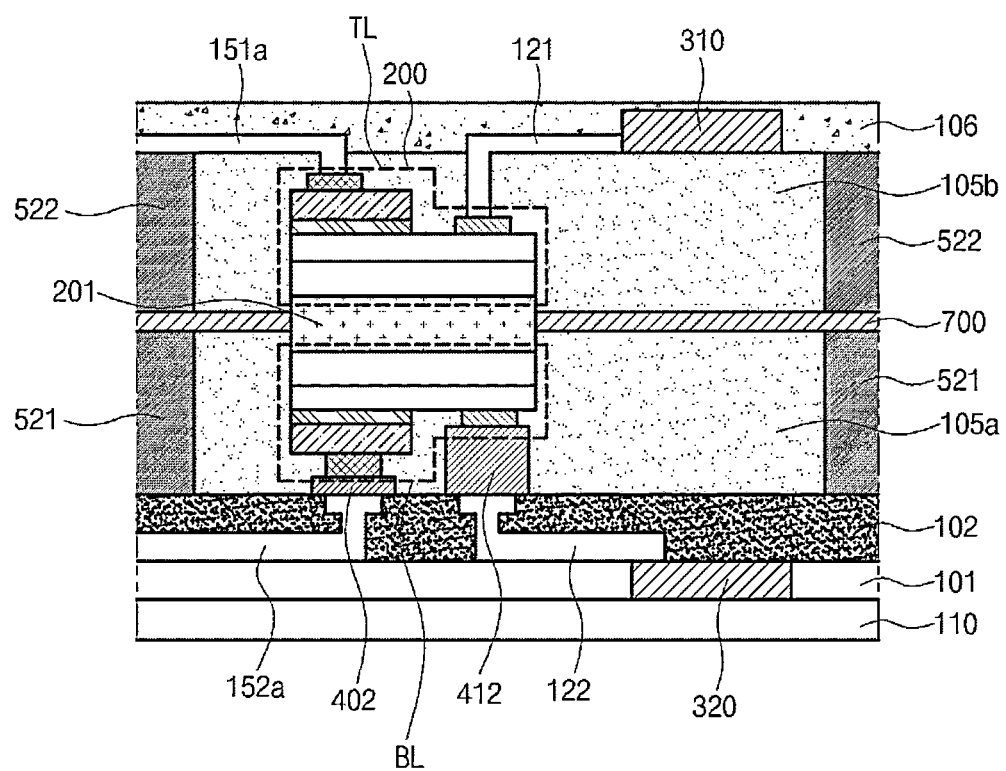

【Figure 19】
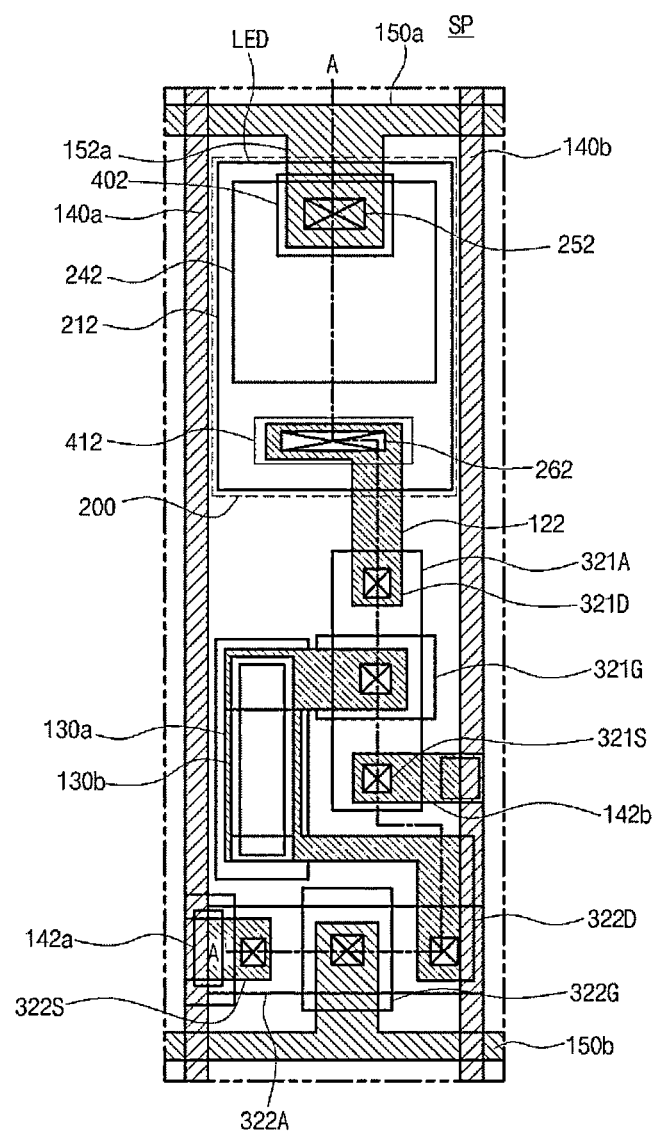

【Figure 20】
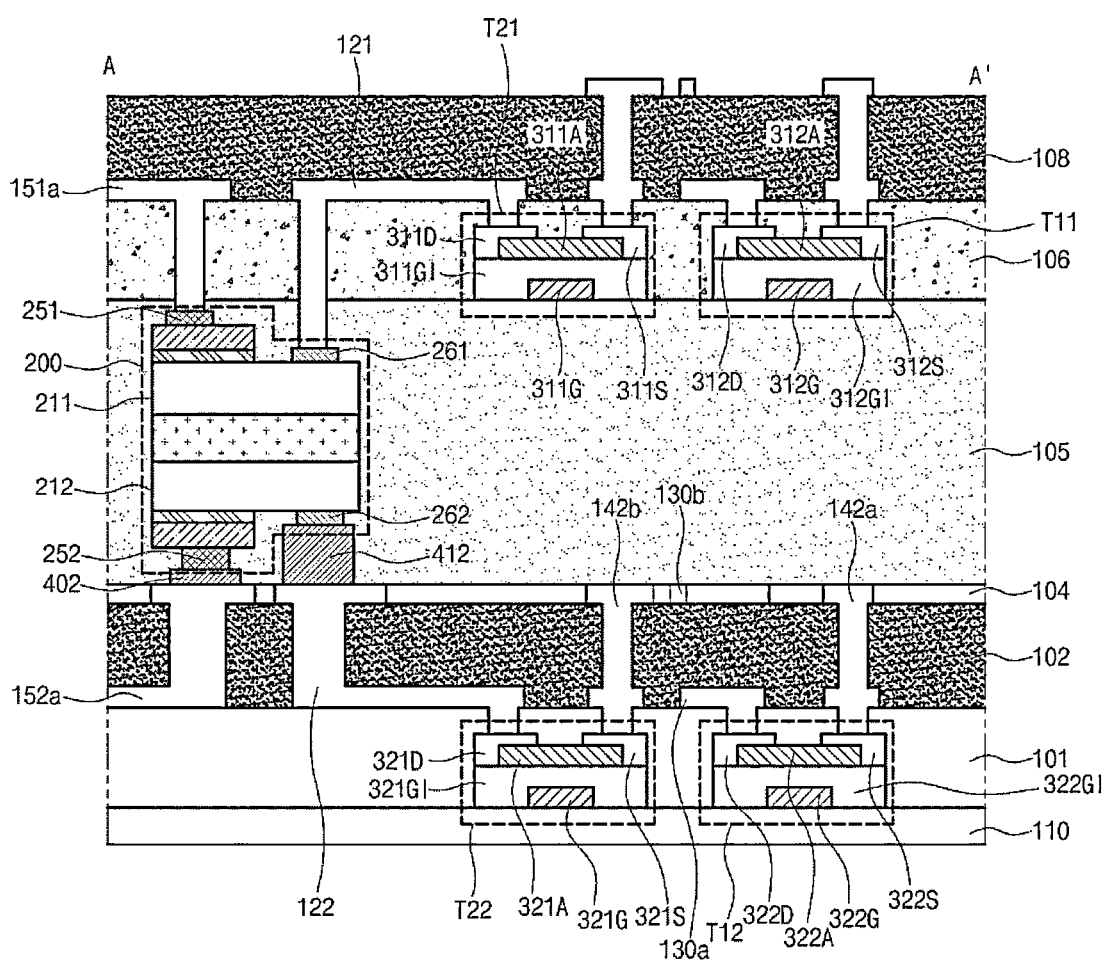

LIGHT EMITTING DIODE DISPLAY DEVICE

TECHNICAL FIELD

The present disclosure relates to a light emitting diode (LED) display device, and more specifically, to a LED display device using an LED providing a dual emission spectrum.

BACKGROUND ART

The application range of the liquid crystal display device (LCD), the organic light emitting display device (OLED), and the quantum dot display device (QD), which have been widely used until now, have gradually expanded.

In the above-described display devices, a plurality of light emitting elements are disposed on a substrate of the display device to realize an image, and a driving element for supplying a driving signal or a driving current to control each light emitting element to emit light individually is disposed on the substrate with the light emitting element. The information is displayed on the substrate by interpreting (driving) the plurality of light emitting elements disposed on the substrate according to the arrangement of information to be displayed.

Since the liquid crystal display is not a self-emission type, a backlight unit disposed to emit light on the rear surface of the liquid crystal display is required. The backlight unit increases the thickness of the liquid crystal display, has limitations in realizing the display device in various designs such as flexible or circular designs, and may reduce luminance and response speed.

Meanwhile, a display device having a self-emission element can be realized to be thinner than a display device having a light source therein, and thus a flexible and foldable display device can be realized. The display device having a self-emission element may be an organic light emitting display device including an organic material as a light emitting layer or an LED display device using an LED as a light emitting element. Since a separate light source is not required in the organic light emitting display device and the LED display device, it can be used as a thinner or various types of display devices.

However, in the organic light emitting display device using an organic material, since bad pixels by oxidation between the organic light emitting layer and the electrode due to the penetration of moisture and oxygen are likely to occur, various technical configurations are additionally required to minimize the penetration of oxygen and moisture.

In order to solve the above problems, research and development of a display device using an LED, which uses an inorganic material, as a light emitting element is being conducted in recent years, and the LED display device is in the spotlight as a next-generation display device because it has high image quality and high reliability.

DISCLOSURE

Technical Problem

The LED element is a semiconductor light emitting element using a characteristic emitting light when a current is passed therethrough. The LED element is widely used in various display devices such as a lighting, a TV, a signage display, a tiling display, and the like. The LED element consists of an n-type electrode, a p-type electrode, and an active layer therebetween. Each of the n-type electrode and the p-type electrode is formed of a semiconductor. When a current flows through the n-type electrode and the p-type electrode, electrons from the n-type electrode and holes from the p-type electrode combine in the active layer to emit light.

The LED element is composed of a compound semiconductor such as GaN and can inject high current due to the nature of the inorganic material to realize high luminance. Since the LED element has low environmental impact such as heat, moisture, and oxygen, the LED element has high reliability.

In addition, since the LED element has an internal quantum efficiency of 90%, which is higher than that of an organic light emitting diode, a high-brightness image can be displayed and there is an advantage in that a display device with low power consumption can be realized.

In addition, unlike the organic light emitting display device, since the inorganic material is used, there is no need for a separate encapsulation film or encapsulation substrate for minimizing the penetration of oxygen and moisture to a level where the effects of oxygen and moisture are insignificant. Accordingly, there is an advantage in that the non-display area of the display device, which is a margin area that may be generated by disposing the encapsulation film or the encapsulation substrate, can be minimized.

The LED element may be classified into a horizontal LED element, in which the n-type electrode and the p-type electrode are formed on the same surface of the LED element, and a vertical LED element, in which the n-type electrode and the p-type electrode face each other. In comparison to the vertical LED element, the horizontal LED element has a smaller light emitting area and higher current density so that it is difficult to generate high luminance and the efficiency may be decreased. In addition, since the area of the horizontal LED element is twice as large as that of the vertical LED element with the same light emission area, the material cost of the LED element is increased.

Accordingly, the inventors of the present disclosure have recognized the above-mentioned problems and invented an LED display device, to which an LED element providing a dual emission spectrum being capable of realizing high luminance and high definition is applied.

An object to be solved according to an embodiment of the present disclosure is to provide an LED display device capable of controlling two active layers, which are included in an LED element providing a dual emission spectrum, using different driving circuits.

An object to be solved according to an embodiment of the present disclosure is to provide an LED display device capable of providing an LED element that can be replaced when a defect occurs using an LED element providing a dual emission spectrum.

An object to be solved according to an embodiment of the present disclosure is to provide a double-sided light emitting type LED display device using an LED element providing a dual emission spectrum.

The objects of the present disclosure are not limited to the objects mentioned above, and other objects not mentioned will be clearly understood by those skilled in the art from the following description.

Technical Solution

In an LED display device according to an embodiment of the present disclosure, the LED display device comprises a second pixel driving circuit on a substrate, an LED element attached to a region not overlapping the second pixel driving circuit and including a first LED element, a second LED element and a growth substrate, an element fixing layer surrounding the LED element, a first pixel driving circuit on the element fixing layer, and an element protecting layer on the first pixel driving circuit, wherein the first LED element is controlled by the first pixel driving circuit, and the second LED element is controlled by the second pixel driving circuit. Accordingly, the LED display device provides a dual emission spectrum, can realize high luminance and high definition, and can prevent a pixel defect.

In an LED display device according to an embodiment of the present disclosure, the LED display device comprises a substrate divided into a display area, where a unit pixel is disposed, and a non-display area, a second pixel driving circuit on the substrate, a second connection electrode electrically connected to the second pixel driving circuit, a second LED element contacting the second connection electrode, a first LED element disposed on the second LED element, a first pixel driving circuit disposed on the first LED element, and a first connection electrode electrically connecting the first LED element and the first pixel driving circuit. Accordingly, the LED display device provides a dual emission spectrum, can realize high luminance and high definition, and can prevent a pixel defect.

Details of other embodiments are included in the detailed description and drawings.

Advantageous Effects

According to the embodiments of the present disclosure, one sub-pixel includes two LED elements and the two LED elements are controlled by different pixel driving circuits, so that the LED display device can realize high luminance and high definition and can prevent a pixel defect.

And, according to the embodiments of the present disclosure, the LED element includes a first LED element and a second LED element, the first LED element and the second LED element are attached to the same growth substrate, and a reflection layer is disposed on the same layer as the growth substrate. As a result, a double-sided light emitting type LED display device can be realized.

Since the contents of the disclosure described in the technical problems to be solved, the technical solution and effects do not specify essential features of the claims, the scope of the claims is not limited by the matters described in the contents of the disclosure.

DESCRIPTION OF DRAWINGS

FIG. 1 is a plan view showing an LED display device according to an embodiment of the present disclosure.

FIG. 2 is a pixel circuit diagram showing a configuration of a sub-pixel of an LED display device according to the embodiment of FIG. 1.

FIG. 3 is a cross-sectional view showing an LED display device, where an LED element providing a dual emission spectrum is disposed, according to an embodiment of the present disclosure.

FIGS. 4 to 9 are cross-sectional views showing a fabricating method of an LED element providing a dual emission spectrum according to an embodiment of the present disclosure.

FIGS. 10 to 15 are cross-sectional views showing an implanting method of an LED element providing a dual emission spectrum according to an embodiment of the present disclosure onto a panel.

FIG. 16 is a cross-sectional view showing an LED display device according to an embodiment of the present disclosure.

FIG. 17 is a cross-sectional view showing an LED display device according to an embodiment of the present disclosure.

FIG. 18 is a cross-sectional view showing an LED display device according to an embodiment of the present disclosure.

FIG. 19 is a plan view showing one sub-pixel on which the pixel driving circuit in FIG. 2 is disposed.

FIG. 20 is a cross-sectional view taken along the line A-A' of FIG. 19.

MODE FOR INVENTION

Advantages and features of the present invention and methods of achieving them will be apparent with reference to the embodiments described below in detail with the accompanying drawings. However, the present invention is not limited to the embodiments disclosed below, but can be realized in a variety of different forms, and only these embodiments allow the disclosure of the present invention to be complete. The present invention is provided to fully inform the scope of the invention to the skilled in the art of the present invention, and the present invention is only defined by the scope of the claims.

The shapes, sizes, proportions, angles, numbers, and the like disclosed in the drawings for explaining the embodiments of the present invention are illustrative, and the present invention is not limited to the illustrated matters. The same reference numerals refer to the same elements throughout the disclosure. In addition, in describing the present invention, if it is determined that a detailed description of the related known technology unnecessarily obscure the subject matter of the present invention, the detailed description thereof can be omitted. When 'including', 'having', 'consisting', and the like are used in this disclosure, other parts may be added unless 'only' is used. When a component is expressed in the singular, cases including the plural are included unless specific statement is described.

In interpreting the components, even if there is no separate explicit description, it is interpreted as including a margin range.

In the case of a description of the positional relationship, for example, when the positional relationship of two parts is described as 'on', 'over', 'under', 'next to', and the like, one or more other parts may be positioned between two parts unless 'right', 'directly' or 'adjacent' is described.

In the case of a description of a temporal relationship, for example, when the temporal relationship is described as 'after', 'following', 'after', 'before', and the like, it includes cases that are not continuous unless 'immediately' or 'directly' is described.

Each feature of the various embodiments of the present disclosure may be partially or wholly connected to or combined with each other and may be technically interlocked and driven. Each of the embodiments may be independently realized from each other or may be realized together with a related relationship.

Hereinafter, an LED display device according to an embodiment of the present disclosure will be described with reference to the accompanying drawings.

FIG. 1 is a plan view showing an LED display device according to an embodiment of the present disclosure, and FIG. 2 is a pixel circuit diagram showing a configuration of a sub-pixel of an LED display device according to the embodiment of FIG. 1.

Referring to FIG. 1 and FIG. 2, the LED display device 100 according to an embodiment of the present disclosure includes a substrate 110 divided into a display area DA, where a plurality of unit pixels UP are presented, and a non-display area NDA.

The unit pixel UP may include a plurality of sub-pixels SP1, SP2 and SP3 presented on a front surface 110a of the substrate 110. Generally, the sub-pixels SP1, SP2 and SP3 respectively emit red light, blue light and green light, but it is not limited thereto. The unit pixel UP may further include a unit pixel emitting white light.

The substrate 110 is an array substrate, where transistors are formed, and includes a plastic material or a glass material.

The substrate 110 in an embodiment may include an opaque material or a colored polyimide material. In this case, a back plate coupled to a rear surface of the substrate 110 may be further included to maintain the substrate 110 in a planar state. The back plate according to an example may include a plastic material, for example, a polyethylene terephthalate material. The substrate 110 according to an example may be a glass substrate. For example, the glass substrate 110 may have a flexible characteristic as a thin glass substrate having a thickness of 100 μm or less.

In addition, the substrate 110 may be divided into a bonding of two or more substrates or two or more layers.

The non-display area NDA may be defined as an area on the substrate 110 except the display area DA, may have a relatively narrow width (or size) compared to the display area DA, and may be defined as a bezel area.

Each of the plurality of unit pixels UP is disposed in the display area DA. In this case, each of the plurality of unit pixels UP has a predetermined first reference pixel pitch along an X-axis direction and a predetermined second reference pixel pitch along a Y-axis direction and is disposed in the display area DA. The first reference pixel pitch and the second reference pixel pitch may be defined as a distance between the central portions of the unit pixels UP adjacent in the X-axis direction or the Y-axis direction, respectively.

In addition, a distance between the sub-pixels SP1, SP2 and SP3 constituting the unit pixel UP may be defined as a first reference sub-pixel pitch and a second reference sub-pixel pitch similarly to the first reference pixel pitch and the second reference pixel pitch.

In the display device 100 including an LED element 200, the width of the non-display area NDA may be equal to or smaller than the pixel pitch or the sub-pixel pitch. Since the non-display area NDA is equal to or smaller than the pixel pitch or the sub-pixel pitch, a tiling display device, where a bezel area is substantially absent, can be realized by the display device 100 having the non-display area NDA, which has the width being equal to or smaller than the pixel pitch or the sub-pixel pitch.

In order to realize a tiling display device or a multi-screen display device in which the bezel area is substantially absent or minimized, the first reference pixel pitch, the second reference pixel pitch, the first reference sub-pixel pitch and the second reference sub-pixel pitch may be constantly maintained in the display area DA of the display device 100. Alternatively, when the display area DA is defined as a plurality of areas and the lengths of the above pitches are different in each of the areas, the pixel pitch in the area being adjacent to the non-display area NDA can be wider than other areas so that a size of the bezel area can be relatively smaller than the pixel pitch. In this case, since the display device 100 having different pixel pitches may cause image distortion, image processing is performed by comparing and sampling with adjacent areas in consideration of the pixel pitch to eliminate image distortion with reducing the bezel area.

A pixel driving circuit for one of the sub-pixels SP1, SP2 and SP3 constituting the unit pixel UP of the display device 100 will be described with reference to FIG. 2. Pixel driving lines are provided on the front surface 110a of the substrate 110 to supply necessary signals into each of the plurality of sub-pixels SP1, SP2 and SP3. The pixel driving lines according to an embodiment of the present disclosure include a horizontal axis line 150, which is connected to pixels arranged along the X axis to provide a signal, and a vertical axis line 140, which is connected to pixels arranged along the Y axis to provide a signal. The horizontal axis line 150 may also be referred to as a gate line and may include a scan line providing a scan signal "Scan" and/or an emission line providing an emission signal. The vertical axis line 140 may include a data line providing a data signal "Vdata" and a power line providing a power signal. In this case, the power signal may include a high potential power voltage "Vdd" and a common power voltage "Vcom". In some cases, a line providing the common power voltage "Vcom" may be included in the horizontal axis line 150.

The horizontal axis line 150 is provided on the front surface 110a of the substrate 110. The horizontal axis lines 150 extend along the horizontal axis direction X of the substrate 110 and are spaced apart from each other with a regular interval along the vertical axis direction Y.

The vertical axis line 140 intersects the horizontal axis line 150 and is provided on the front surface 110a of the substrate 110. The vertical axis lines 140 extend along the vertical axis direction Y of the substrate 110 and are spaced apart from each other with a regular interval along the horizontal axis direction X.

Each of the sub-pixels SP1, SP2 and SP3 is provided in a sub-pixel region defined by the horizontal axis line 150 and the vertical axis line 140. In addition, each of the sub-pixels SP1, SP2 and SP3 may be defined as an area of a minimum unit in which actual light is emitted.

Three adjacent sub-pixels SP1, SP2 and SP3 may constitute one unit pixel UP for color display. For example, one unit pixel UP includes a red sub-pixel SP1, a green sub-pixel SP2, and a blue sub-pixel SP3 adjacent to each other along the horizontal axis direction X, and may further include a white sub-pixel to improve the luminance. Alternatively, in the case that an LED display device including an LED element providing a double-sided emission spectrum according to an embodiment of the present disclosure is realized, two adjacent sub-pixels may constitute one unit pixel for color display. In this case, the two sub-pixels may be provided to emit red, green, and blue light. For example, one of the two sub-pixels may emit red light, and the other one of the two sub-pixels may emit green and blue light.

Each of the plurality of sub-pixels according to an embodiment of the present disclosure includes a pixel driving circuit and an LED element 200.

The pixel driving circuit is provided in a circuit region defined in each sub-pixel and connected to adjacent gate line, adjacent data line and adjacent power line. The pixel driving circuit controls a current through the LED element 200 based on the high potential power voltage "Vdd" provided through the high potential power line and according to the data voltage "Vdata" provided through the data line in response to the scan signal "Scan" provided through the scan line. The pixel driving circuit according to the embodiment of the present disclosure includes a first transistor T1, a second transistor T2 and a capacitor Cst. The first transistor T1 and the second transistor T2 may be provided as an NMOS type thin film transistor. However, the embodiment of the present disclosure is not limited thereto. For example, the first transistor T1 may be provided as an NMOS type thin film transistor having good off-current characteristics, and the second transistor T2 may be provided as a PMOS type thin film transistor having good response characteristics.

The LED element 200 is mounted on each of the sub-pixels. The LED element 200 is electrically connected to the pixel driving circuit of the corresponding sub-pixel and the high potential power line, so that light is emitted by the current of an p-type electrode of the LED element 200 supplied from the driving transistor, i.e., the second transistor T2. The LED element 200 according to an embodiment of the present disclosure is an LED element providing a dual emission spectrum and may be an optical element or a light-emitting diode chip emitting one of red light, green light, blue light, white light, red and green light, red and blue light and green and blue light. For example, when the LED element 200 emits red light, red light of the same wavelength or red light of different wavelengths may be emitted. In this instance, the light-emitting diode chip may have a scale of 1 to 100 $\mu m^2$, but it is not limited thereto. The light-emitting diode chip may have a size smaller than the size of the light emitting area of the sub-pixel area except for the circuit area occupied by the pixel driving circuit.

The second transistor T2 is a driving element that controls the current flowing through the LED element 200 according to the voltage between a gate electrode and a source electrode of the second transistor T2. The second transistor T2 includes the gate electrode connected to the first node n1, a drain electrode connected to the second node n2 and the source electrode connected to the third node n3.

The first transistor T1 is connected between the first node n1 and the fourth node n4 and is switched according to the scan signal "Scan". A gate electrode of the first transistor T1 is connected to the scan line to which the scan signal "Scan" is applied, and the fourth node n4 is connected to the data voltage line. When the first transistor T1 is turned on, the data voltage "Vdata" is transferred to the gate electrode of the second transistor T2 and the second transistor T2 is turned on.

The capacitor Cst includes a first electrode and a second electrode, and the first electrode and the second electrode are respectively connected to the first node n1 and the third node n3. The capacitor Cst is formed in an overlapping region of the first electrode and the second electrode. The second electrode of the capacitor Cst is connected to the third node n3 and fixed to the common power voltage "Vcom", and the first electrode stores the data voltage "Vdata" received from the first transistor T1. The data voltage "Vdata" stored in the capacitor Cst enables the second transistor T2 to provide the same driving current to the LED element 200 for one frame.

The pixel driving circuit according to the embodiment of the present disclosure is not limited to the above-described configuration of the first transistor T1, the second transistor T2 and the capacitor Cst, but may further include a transistor controlled by an additional scan signal, a transistor controlled by an emission signal and/or auxiliary capacitor.

FIG. 3 is a cross-sectional view showing an LED display device, where an LED element providing a dual emission spectrum is disposed, according to an embodiment of the present disclosure.

Referring to FIG. 3, each sub-pixel of an display device 100 according to an embodiment of the present disclosure includes an LED element 200, a first pixel driving circuit 310 and a second pixel driving circuit 320 for providing a driving current to the LED element 200, a third insulating layer 105 for protecting and fixing the LED element 200, and electrodes for connecting the LED element 200 and the pixel driving circuits 310 and 320. The third insulating layer 105 may be referred to as an element fixing layer or a planarization layer.

As described with reference to FIG. 2, each of the pixel driving circuits 310 and 320 may be realized by including the first transistor T1, the second transistor T2 and the capacitor Cst. In FIG. 3, the pixel driving circuits 310 and 320 are shown in blocks.

As described above, the substrate 110 is a substrate for supporting components of the LED display device 100 and may be an insulating substrate. For example, the substrate 110 may be made of glass or resin, and may include polymer or plastic to have flexibility.

The second pixel driving circuit 320 is disposed on the substrate 110, and a first insulating layer 101 for protecting the second pixel driving circuit 320 and reducing a step difference on the substrate by the second pixel driving circuit 320 is disposed on the second pixel driving circuit 320.

A second n-connection electrode 122 and a second p-connection electrode 152a, which are electrically connected to a second n-electrode 262 and a second p-electrode 252 of the LED element 200, respectively, are disposed on the first insulating layer 101. The second n-connection electrode 122 electrically connects the second n-electrode 262 of the LED element 200 and the second pixel driving circuit 320, and the second p-connection electrode 152a electrically connects the high potential power line and the second p-electrode 252.

A second insulating layer 102, which includes a contact hole exposing the second n-connection electrode 122 and the second p-connection electrode 152a for connection of the second n-connection electrode 122 and the second p-connection electrode 152a to the second n-electrode 262 and the second p-electrode 252, is disposed on the second n-connection electrode 122 and the second p-connection electrode 152a, and a reflection layer 104 for improving the light extraction efficiency of the LED element 200 is disposed on the second insulating layer 102. The reflection layer 104 overlaps the LED element 200. The reflection layer 104 is formed to expose the second n-connection electrode 122 and the second p-connection electrode 152a. On the reflection layer 104, the LED element 200 is attached to the exposed second n-connection electrode 122 and the exposed second p-connection electrode 152a. In some cases, the reflection layer 104 may be omitted.

The LED element 200 includes two active layers 231 and 232 and provides a dual emission spectrum. The LED element 200 includes a growth substrate 201, n-type layers 211 and 212, the active layers 231 and 232, p-type layers 241 and 242, n-electrodes 261 and 262, and p-electrodes 251 and 252. The LED element 200 includes a first LED element and a second LED element realized in a horizontal structure. The first LED element and the second LED element are formed with the growth substrate 201 therebetween. The first LED element includes a first n-type layer 211, a first active layer 231, a first p-type layer 241, a first n-electrode 261 and a first p-electrode 251, and the second LED element includes a second n-type layer 212, a second active layer 232, a second n-electrode 262 and a second p-electrode 252. A detailed description of the stacked structure of the first LED element and the second LED element will be described later.

The second n-connection electrode 122 exposed through the reflection layer 104 is connected to the second n-electrode 262 of the second LED element through a second bonding part 412, and the second p-connection electrode 152a is connected to the second p-electrode 252 of the second LED element through a first bonding part 402.

The third insulating layer 105 is formed on the second pixel driving circuit 320 and the LED element 200 in an area excluding the contact hole to planarize the display area DA. The third insulating layer 105 may be referred to as a planarization layer or a fixing layer.

The first pixel driving circuit 310 is disposed on the third insulating layer 105. The first pixel driving circuit 310 is connected to the first n-connection electrode 121 of the first LED element, and the first p-connection electrode 151a is connected to the common power line. In addition, a fourth insulating layer 106 for protecting the LED element 200 and the first pixel driving circuit 310 is disposed on the LED element 200 and the first pixel driving circuit 310.

FIGS. 4 to 9 are cross-sectional views showing a fabricating method of an LED element providing a dual emission spectrum according to an embodiment of the present disclosure.

Referring to FIG. 4, a growth substrate 201 is prepared to form an electrode of the LED element 200. The growth substrate 201 may include sapphire, silicon (Si), indium phosphide (InP), gallium arsenide (GaAs), or the like. Sapphire or silicon may be mainly used to realize an LED element capable of expressing green light or blue light, and gallium arsenide and indium phosphide may be mainly used to realize an LED element capable of expressing red light. In this case, the transmittance of the LED display device can be improved by transferring the growth substrate 201 formed of gallium arsenide to a sapphire substrate later. Alternatively, the growth substrate 201 formed of gallium arsenide may be replaced with a sapphire substrate.

The first n-type layer 211 is formed on one side of the growth substrate 201 using a chemical growth method. In this case, the chemical growth method may be MOCVD (metal organic chemical vapor deposition). The first n-type layer 211 is a semiconductor layer in which free electrons having a negative charge move as carriers to generate a current, and may be made of a GaN-based material (n-GaN) doped with an n-type impurity. The GaN-based material may be GaN, AlGaN, InGaN, or AlInGaN, and Si, Ge, Se, Te, or C may be used as impurities used for doping the first n-type layer 211. In some cases, a buffer layer such as an undoped GaN-based semiconductor layer may be additionally formed between the growth substrate 201 and the first n-type layer 211.

For example, in order to realize the first LED element to express blue light or green light, the first n-type layer 211 may include two layers of a layer formed of an undoped gallium nitride (un-GaN) and a layer formed of doped gallium nitride (n-GaN) by doping the n-type impurities thereon. For example, the n-type impurity may be one of Si, Ge, Se, Te, and C.

Alternatively, the first n-type layer 211 may be indium aluminum phosphide (n-AlInP) doped with n-type impurities. For example, in order to realize the first LED device to express red light, the first n-type layer 211 may be formed of indium aluminum phosphide (n-AlInP) doped with n-type impurities.

The first active layer 231 is formed on the first n-type layer 211. The first active layer 231 is disposed on the first n-type layer 211 and may have a multi-quantum well (MQW) structure including a well layer and a barrier layer having a higher band gap than the well layer. For example, the first active layer 231 may have the multi-quantum well structure such as AlGaInP, GaInP, InGaN, or GaN.

The first p-type layer 241 is formed on the first active layer 231. The first p-type layer 241 is a semiconductor layer in which holes having a positive charge move as carriers to generate a current, and may be made of a GaN-based material doped with p-type impurities (p-GaN). The GaN-based material may be GaN, AlGaN, InGaN, or AlInGaN, and Mg, Zn, or Be may be used as impurities used for doping the first p-type layer 241.

A first patterning layer 291 is formed on the first p-type layer 241. The first patterning layer 291 is formed of an insulating material to protect the first p-type layer 241 and may be used to pattern a pad electrode to be formed on the first p-type layer 241 later.

Referring to FIG. 5, after turning over the growth substrate 201 on which the first LED element 211, 231 and 241 epitaxially grown in FIG. 4 and the first patterning layer 291 formed by the deposition process are formed, the second LED element 212, 232 and 242 are formed on the other side of the growth substrate 201. Since each layer constituting the second LED element 212, 232 and 242 is formed in the same order and the same material as each layer constituting the first LED element 211, 231 and 241, further description will be omitted. The second n-type layer 212 corresponds to the first n-type layer 211, the second active layer 232 corresponds to the first active layer 231, and the second p-type layer 242 corresponds to the first p-type layer 241. However, the second active layer 232 may be formed of a material for emitting light of the same color as the first active layer 231 or a material for emitting light of a different color from the first active layer 231. For example, when the first active layer 231 and the second active layer 232 are formed to emit blue light and green light, respectively, the content of indium included in the first active layer 231 and the second active layer 232 may be different.

In addition, a thickness of the growth substrate 201 may be adjusted by polishing the growth substrate 201 before growing the second LED element 212, 232 and 242.

Moreover, a second patterning layer 292 is formed on the second p-type layer 242 of the second LED element. Like the first patterning layer 291, the second patterning layer 292 is also formed of an insulating material to protect the second p-type layer 242 and may be used for patterning a pad electrode to be formed on the second p-type layer 242 later. For example, the first patterning layer 291 and the second patterning layer 292 may be a silicon oxide layer, a silicon nitride layer, or a silicon oxynitride layer.

Referring to FIGS. 6 and 7, a process exposing the n-type layer and the p-type layer is performed onto the LED element including the first LED element, the second LED element with the second patterning layer 292 and providing the dual emission spectrum. First, a first contact hole h1 for exposing the second p-type layer 242 is formed by removing the second patterning layer 292 of the second LED element. At the same time, a second contact hole h2 for exposing the second n-type layer 212 is formed by removing not only the second patterning layer 292 of the second LED element but also the second p-type layer 242 and the second active layer 232 of the second LED element.

Next, a third contact hole h3 for exposing the first p-type layer 241 is formed by removing the first patterning layer 291 of the first LED element. At the same time, a fourth contact hole h4 for exposing the first n-type layer 211 is formed by removing not only the first patterning layer 291 of the first LED element but also the first p-type layer 241 and the first active layer 231 of the first LED element. In this case, in order to form the second contact hole h2 and the fourth contact hole h4, it can be formed using a method such as mesa etching that can etch even an epitaxial layer.

Referring to FIG. 8, the electrodes are formed in the first contact hole h1 to the fourth contact hole h4 formed in FIGS. 6 and 7. The second p-electrode 252 and the first p-electrode 251 are formed in the first contact hole h1 and the third contact hole h3, respectively. The second p-electrode 252 and the first p-electrode 251 are formed to contact the second p-type layer 242 and the first p-type layer 241, respectively. In addition, the second n-electrode 262 and the first n-electrode 261 are formed in the second contact hole h2 and the fourth contact hole h4, respectively. The second n-electrode 262 and the first n-electrode 261 are formed to contact the second n-type layer 212 and the first n-type layer 211, respectively.

Accordingly, by providing a negative load to the first n-electrode 261 and a positive load to the first p-electrode 251, electrons and holes from the first n-type layer 211 and the first p-type layer 241, respectively, are gathered and recombined in the first active layer 231 so that light is emitted from the first active layer 231. Moreover, by providing a negative load to the second n-electrode 262 and a positive load to the second p-electrode 252, electrons and holes from the second n-type layer 212 and the second p-type layer 242, respectively, are gathered and recombined in the second active layer 232 so that light is emitted from the second active layer 232.

Referring to FIG. 9, the patterning layers 291 and 292 deposited to form the p-electrodes 251 and 252 and the n-electrodes 261 and 262 are removed to complete the LED element 200. The patterning layers 291 and 292 are formed for the p-electrodes 251 and 252 and the n-electrodes 261 and 262, but are also used to protect the p-type layers 241 and 242 during the LED device chip process. The patterning layers 291 and 292 may be removed using a wet etching method using an etchant for the silicon oxide layer. For example, the etchant may be composed of H2O, HF, and NH4F.

FIGS. 10 to 15 are cross-sectional views showing an implanting method of an LED element 200 providing a dual emission spectrum according to an embodiment of the present disclosure onto a panel.

Referring to FIG. 10, a driving substrate, where the second pixel driving circuit 320, the second n-connection electrode 122 and the second p-connection electrode 152a are formed on the substrate 110, is prepared. Although the second insulating layer 102 formed on the second n-connection electrode 122 and the second p-connection electrode 152a is illustrated as a single layer, the second insulating layer 102 may be formed of a plurality of layers. In addition, the reflection layer 104 is formed to expose the second n-connection electrode 122 and the second p-connection electrode 152a. The reflection layer 104 is formed to overlap the LED element 200 to prevent light absorption into the driving substrate and improve light extraction efficiency. For example, the reflection layer 104 can be realized as a single layer of a distributed bragg reflector (DBR), a single layer of a nano film, a silicon oxide layer or a titanium dioxide layer or multiple layers of a silicon oxide layer and a titanium dioxide layer. An embodiment of the present disclosure, in which the reflection layer 104 is disposed, may be a top emission type LED display device. If the display device 100 according to the embodiment of the present disclosure is a bottom emission type, the reflection layer 104 may be omitted or may be disposed on the LED element 200.

Referring to FIG. 11, on the reflective layer 104, the LED element 200 is attached to the exposed second n-connection electrode 122 and the exposed second p-connection electrode 152a. Since the second LED element among the LED elements 200 is connected to the second n-connection electrode 122 and the second p-connection electrode 152a, the light emission of the second LED element can be controlled by the second pixel driving circuit 320 included in the driving substrate.

The second n-electrode 262 and the second p-electrode 252 of the second LED element are disposed to be attached to the second n-connection electrode 122 and the second p-connection electrode 152a, respectively. On the reflection layer 104, the second bonding part 412 is formed on the exposed second n-connection electrode 122 to be electrically connected to the second n-electrode 262 of the second LED element. On the reflection layer 104, the first bonding part 402 is formed on the exposed second p-connection electrode 152a to be electrically connected to the second p-electrode 252 of the second LED element. The first bonding part 402 and the second bonding part 412 may be an alloy using at least one of Sn, Pb, Ag, Cu, and Au as a metal material.

Referring to FIG. 12, the third insulating layer 105 for planarizing the display area DA of the LED display device and fixing the LED element 200 is formed on the driving substrate to which the LED element 200 is attached. For example, since the third insulating layer 105 is advantageous as the visible light transmittance is higher, the third insulating layer 105 may be formed of photoacryl, silicon oxide, silicon nitride, or the like. The third insulating layer 105 may be formed by a coating method when the thickness of the LED element 200 is thick, or by a deposition method when the thickness of the LED element 200 is thin. The reference for the thickness of the LED element 200 may vary depending on the thickness of the growth substrate 201.

Referring to FIGS. 13 and 14, the first pixel driving circuit 310 is formed on the third insulating layer 105. The third insulating layer 105 is etched to correspond to the first p-electrode 251 and the first n-electrode 261. The first p-connection electrode 151a and the first n-connection electrode 121 are formed on the etched region and the third insulating layer 105. The first n-electrode 262 of the first LED element and the first pixel driving circuit 310 are electrically connected by the first n-connection electrode 121, and the first p electrode 251 and the common power line are electrically connected by the first p-connection electrode 151a. Since the first LED element among the LED elements 200 is connected to the first connection electrodes 151a and 121, the light emission of the first LED element can be controlled by the first pixel driving circuit 310 formed on the third insulating layer 105.

Referring to FIG. 15, the fourth insulating layer 106 for protecting the LED element 200 and the first pixel driving circuit 310 is formed on the LED element 200, the third insulating layer 105 and the first pixel driving circuit 310. The fourth insulating layer 106 is advantageous as the visible light transmittance is higher like the third insulating layer 105, the fourth insulating layer 106 may be formed of photoacryl, silicon oxide, silicon nitride, or the like. The fourth insulating layer 106 may be referred to as an element protection layer.

The first LED element and the second LED element of the LED element 200 providing the dual emission spectrum may emit light of different colors or may emit light of the same color.

When the first LED element and the second LED element emit light of different colors, the emission area may be increased by arranging two sub-pixels in a unit pixel. In this case, for example, the first LED element and the second LED element included in one of the two sub-pixels are realized to emit blue light and green light, respectively, and both the first LED element and the second LED element included in the other one of the two sub-pixels are realized to emit red light.

When the first LED element and the second LED element emit light of the same color, luminance can be improved. When the defect is generated in one of the first LED element and the second LED element and/or one of the first pixel driving circuit 310 and the second pixel driving circuit 320, the other one of the first LED element and the second LED element and/or the other one of the first pixel driving circuit 310 and the second pixel driving circuit 320 can replace the defected one.

FIG. 16 is a cross-sectional view showing an LED display device according to an embodiment of the present disclosure.

The material of the active layers 231 and 232 included in the LED element 200 may be changed so that the sub-pixels emit red, green, or blue light, respectively. Alternatively, when the LED elements 200 included in the sub-pixels have the same color, the LED display device can be realized to emit red light, green light and blue light from the sub-pixels by providing a color conversion layer 600 on the LED elements 200. The LED display device according to an embodiment of the present disclosure is an embodiment using the color conversion layer 600, and all of the LED elements 200 are provided to emit blue light.

In the structure of FIG. 15 described above, both the first active layer 231 and the second active layer 232 included in the LED element 200 are formed of a material for emitting blue light. Then, the color conversion layer 600 is formed on the fourth insulating layer 106 in a region overlapping the LED element 200.

The color conversion layer 600 includes a color conversion material 601. In the case of a sub-pixel emitting blue light, an insulating layer that does not include the color conversion material 601 may be used. In this case, the insulating layer may be formed of a material such as photoacryl, silicon oxide, or silicon nitride. In the case of a sub-pixel emitting green light or red light, the color conversion material 601 may use a fluorescent substance, a nano-organic material, a quantum dot, and the like. In this case, the color conversion material 601 may be mixed with a material, such as photo-acryl, silicon oxide, or silicon nitride, and a coating, printing, or dotting method may be performed to form the color conversion layer 600. For example, the fluorescent substance may be used when the size of the pixel is as large as several tens to several hundreds of micrometers, and the nano-organic material and the quantum dot may be used when the size of the pixel is as small as several to several tens of micrometers.

The color conversion layer 600 may be formed separately for each sub-pixel. By forming a black matrix 500 between the adjacent color conversion layers 600, the sub-pixels can be divided and the color mixing in sub-pixels can be prevented. The black matrix 500 may be formed on the same layer as the color conversion layer 600.

A fifth insulating layer 108 is formed on the color conversion layer 600 and the black matrix 500 over the entire surface of the substrate 110. The fifth insulating layer 108 protects the color conversion layer 600 and the black matrix 500. The fifth insulating layer 108 may be formed of a material such as photoacryl, silicon oxide, or silicon nitride.

FIG. 17 is a cross-sectional view showing an LED display device according to an embodiment of the present disclosure. In the LED display device according to an embodiment of the present disclosure, a case in which two sub-pixels are included in a unit pixel will be described. Components overlapping those of FIG. 3 may be omitted or simplified.

The unit pixel includes a first sub-pixel and a second sub-pixel, the first sub-pixel may emit two of red, green, and blue lights, and the second sub-pixel may emit the other one of red, green, and blue lights. For example, the first sub-pixel may emit green light and blue light, and the second sub-pixel may emit red light. The first sub-pixel includes a first LED element L1 and a second LED element L2, and the first LED element L1 and the second LED element respectively emit green light and blue light. In addition, the second sub-pixel includes a third LED element L3 and a fourth LED element L4, and both the third LED element L3 and the fourth LED element L4 may emit red light. When the unit pixel includes two sub-pixels, the definition can be improved by 50% compared to the case where the unit pixel includes three sub-pixels.

The emitting efficiency can be improved by realizing the color with the lowest efficiency among blue, green, and red in one sub-pixel. In order to achieve the target luminance of the LED display device, a structure, in which green light with high visibility emits from the active layer 231 positioned on the upper side and blue light with relatively low visibility emits from the active layer 232 positioned on the lower side is illustrated as an example, but it is not limited thereto. In some cases, it can be realized that a color lacking in luminance may be emitted from an active layer positioned on the upper side.

The first LED element L1 and the second LED element L2 may have the same structure as those of the previously described embodiment of FIG. 3.

The third LED element L3 includes a third n-type layer 213, a third active layer 233, a third p-type layer 243, a third p-electrode 253 and a third n-electrode 263, and the fourth LED element L4 includes a fourth n-type layer 214, a fourth active layer 234, a fourth p-type layer 244, a fourth p-electrode 254 and a fourth n-electrode 264. The third LED element L3 and the fourth LED element L4 have a structure to emit red light, and the third active layer 233 and the fourth active layer 234 may be formed of the same material. In addition, indium aluminum phosphide (n-AlInP) doped with n-type impurities may be used for the third n-type layer 213 and the fourth n-type layer 214.

When the third LED element L3 and the fourth LED element L4 emitting red light are formed, the growth substrate 203 formed of gallium arsenide (GaAs) may be used. After forming the third LED element L3 on a front surface of the growth substrate 203 and forming the fourth LED element L4 on a rear surface of the growth substrate 203, the LED elements L3 and L4, which are respectively formed on the front surface and the rear surface of the growth substrate 203, are detached and transferred to a sapphire substrate. Since the sapphire substrate has higher transmittance than the gallium arsenide substrate, the transmittance of the sub-pixel may be improved.

The first LED element L1 and the third LED element L3 are respectively controlled by the first pixel driving circuit 310 and the third pixel driving circuit 313 formed on the third insulating layer 105, and the second LED element L2 and the fourth LED element L4 are respectively controlled by the second pixel driving circuit 320 and the fourth pixel driving circuit 324 included in the driving substrate. Although the third LED element L3 and the fourth LED element L4 emit light of the same color, they are controlled by different pixel driving circuits. Accordingly, the third LED element L3 and the fourth LED element L4 can serve as redundancy to each other, thereby preventing pixel defects.

The third insulating layer 105 serves to protect and fix the LED elements L1, L2, L3, and L4, and the black matrix 510 is formed between the third insulating layers 105 formed in the two sub-pixels to prevent color mixing between the sub-pixels.

The connection electrodes 121 and 123 connecting the pixel driving circuits 310 and 313 and the LED elements L1 and L3 are formed on the third insulating layer 105 and the black matrix 510, the fourth insulating layer 106 is formed on the third insulating layer 105 and the black matrix 510 to cover the connection electrodes 121, 123, 151a and 153a and the pixel driving circuits 310 and 313. The fourth insulating layer 106 protects the connection electrodes 121, 123, 151a and 153a and the pixel driving circuits 310 and 313.

Since the LED display device according to the embodiment of the present disclosure is a top emission type, the reflection layer 104 is disposed between the driving substrate and the LED device. Alternatively, in the case of a bottom emission type, the reflection layer 104 may be disposed on the LED device. Alternatively, the reflection layer 104 may be omitted.

FIG. 18 is a cross-sectional view showing an LED display device according to an embodiment of the present disclosure. An LED display device according to an embodiment of the present disclosure describes an LED display device capable of a double-sided light emission. Components overlapping those of FIG. 3 may be omitted or simplified.

Since the LED display device according to the embodiment of the present disclosure shows one sub-pixel and is a double-sided light emitting type, the insulating layer and the substrate 110 stacked on the upper and lower portions of the LED element 200 are formed of a material having high transmittance. In addition, in order for light to be emitted to the front and rear surfaces of the LED display device, the above-described reflection layer 104 should be omitted.

The connection electrodes 122 and 152a on the driving substrate are attached to the LED element 200 through bonding parts 402 and 412. The LED element 200 according to an embodiment of the present disclosure includes an upper LED element TL and a lower LED element BL, and the lower LED element BL is connected to the driving substrate through bonding parts 402 and 412. Next, a lower insulating layer 105a is formed on the driving substrate and around the LED element 200. The lower insulating layer 105a is formed to completely surround the lower LED element BL between the growth substrate 201 and the bonding parts 402 and 412. In this case, a portion of the growth substrate 201 may be exposed to the air. The lower insulating layer 105a may be formed of photo-acryl, silicon oxide or silicon nitride because it is advantageous as the visible light transmittance is higher. The lower insulating layer 105a may be formed by a coating method when the thickness of the LED element 200 is thick, or by a deposition method when the thickness of the LED element 200 is thin. A first black matrix 521 is formed on the same layer as the lower insulating layer 105a. The first black matrix 521 may be formed at the boundary between adjacent sub-pixels to prevent color mixing between the sub-pixels.

In order to emit light to the front and rear surfaces of the LED display device according to an embodiment of the present disclosure, a reflection layer 700 for double-sided emission is formed on the lower insulating layer 105a and the first black matrix 521. The reflection layer 700 for double-sided emission is formed in contact with the growth substrate 201 so that the light emitted from the lower LED element BL is toward the rear side of the LED display device and the light emitted from the upper LED element TL is toward the front side of the LED display device. Namely, the reflection layer 700 for double-sided emission is positioned on the same plane as the growth substrate 201 to be parallel to the substrate 110. The reflection layer 700 for double-sided emission can be realized as a single layer of a distributed bragg reflector (DBR), a single layer of a nano film, a silicon oxide layer or a titanium dioxide layer or multiple layers of a silicon oxide layer and a titanium dioxide layer, but it is not limited thereto. Other material having high reflectance can be used for the reflection layer 700 for double-sided emission.

An upper insulating layer 105b and a second black matrix 522 are formed on the reflection layer 700 for double-sided emission. The upper insulating layer 105b is made of the same material as the lower insulating layer 105a and completely covers the upper LED element TL. The second black matrix 522 is formed of the same material as the first black matrix 521 at the boundary between adjacent sub-pixels.

The upper insulating layer 105b provides contact holes for forming the first connection electrodes 121 and 151a. The first connection electrodes 121 and 151a are formed in the contact hole formed in the upper insulating layer 105b and on the upper insulating layer 105b and the second black matrix 522. The first n-connection electrode 121 is connected to the first pixel driving circuit 310, and the first p-connection electrode 151a is connected to the common power line. In addition, the fourth insulating layer 106 is formed on the first connection electrodes 121 and 151a and the first pixel driving circuit 310.

The LED display device according to an embodiment of the present disclosure includes the upper LED element TL and the lower LED element BL, the reflection layer 700 for double-sided emission is formed to contact the growth substrate 201 at a boundary between the upper LED element TL and the lower LED element BL. As a result, the LED display device can emit light toward the front side and the rear side. In this instance, each of the bonding parts 402 and 412 can be formed of a transparent or semi-transparent conductive material.

FIG. 19 is a plan view showing one sub-pixel SP, on which the pixel driving circuit in FIG. 2 is disposed, and shows the LED element attached to the driving substrate. FIG. 20 is a cross-sectional view taken along the line A-A' of FIG. 19 and shows both the first pixel driving circuit and the second pixel driving circuit. Hereinafter, FIGS. 19 and 20 will be described, and components overlapping those of FIG. 2 may be simplified or omitted.

One sub-pixel SP includes the data line 140a and the common power line 140b disposed along a vertical axis and includes the high potential power line 150a and the scan line 150b disposed along a horizontal axis.

With respect to the LED element 200, the second pixel driving circuit is disposed between the LED element 200 and the substrate 110, and the first pixel driving circuit is disposed between the LED element 200 and the fifth insulating layer 108. The LED element 200 is disposed in a region that does not overlap the first pixel driving circuit and the second pixel driving circuit, so that light emitted from the LED element 200 is not blocked by the pixel driving circuit. The first pixel driving circuit and the second pixel driving circuit are realized with the same structure. The first pixel driving circuit includes a first transistor T11 and a second transistor T21, and the second pixel driving circuit includes a first transistor T12 and a second transistor T22. The first insulating layer 101 for protecting the second pixel driving circuit covers the second pixel driving circuit and is illustrated as a single layer. However, it is not limited thereto, and the first insulating layer 101 may be formed of a plurality of layers. Similarly, the fourth insulating layer 106 for protecting the first pixel driving circuit covers the first pixel driving circuit and is illustrated as a single layer. However, it is not limited thereto, and the fourth insulating layer 106 may be formed of a plurality of layers.

The first transistors T11 and T12 included in the first pixel driving circuit and the second pixel driving circuit include the gate electrodes 322G and 312G, the semiconductor layers 322A and 312A, the source electrodes 322S and 312S, and the drain electrodes 322D and 312D, respectively. The second transistors T22 and T21 include the gate electrodes 321G and 311G, the semiconductor layers 321A and 311A, the source electrodes 321S and 311S, and the drain electrodes 321D and 311D, respectively. In the first transistors T11 and T12 and the second transistors T22 and T21, the gate insulating layers 322GI, 321GI, 312GI and 311GI are included between the gate electrodes 322G, 321G, 312G and 311G and the semiconductor layers 322A, 312A, 321A and 311A. The gate insulating layers 322GI and 321GI included in the second pixel driving circuit may be formed as a single layer on the substrate 110, and the gate insulating layers 312GI and 311GI included in the first pixel driving circuit may be formed as a single layer on the third insulating layer 105.

The gate electrodes 322G, 312G, 321G and 311G are formed on the same layer and of the same material as the scan line 150b on the substrate 110. The gate electrodes 322G, 312G, 321G and 311G may include a semiconductor such as silicon (Si), one of a conductive metal, e.g., molybdenum (Mo), aluminum (Al), chromium (Cr), gold (Au), titanium (Ti), nickel (Ni), neodymium (Nd) and copper (Cu), or their alloy and may have a multilayer thereof.

The gate insulating layers 322GI, 321GI, 312GI and 311GI may be formed of a single layer or a plurality of layers made of an inorganic material, and may be made of silicon oxide (SiOx), silicon nitride (SiNx), or the like.

The semiconductor layers 322A, 321A, 312A and 311A are provided in a predetermined pattern shape on the gate insulating layers 322GI, 321GI, 312GI and 311GI to overlap the gate electrodes 322G, 312G, 321G and 311G. The semiconductor layers 322A, 321A, 312A and 311A may be made of a semiconductor material of one of amorphous silicon, polycrystalline silicon, oxide, and an organic material, but it is not limited thereto.

The source electrodes 322S, 321S, 312S and 311S are disposed to overlap one side of the semiconductor layers 322A, 321A, 312A and 311A and are formed on the same layer and of the same material as the data line 140a and the high-potential power line 150a.

The drain electrodes 322D, 321D, 312D and 311D are disposed to overlap the other side of the semiconductor layers 322A, 321A, 312A and 311A and to be spaced apart from the source electrodes 322S, 321S, 312S and 311S. The drain electrodes 322D, 321D, 312D and 311D are formed on the same layer and of the same material as the source electrode 322S, 321S, 312S and 311S at the same time.

The source electrodes 322S, 321S, 312S and 311S and the drain electrodes 322D, 321D, 312D and 311D may include a semiconductor such as silicon (Si), one of a conductive metal, for example, molybdenum (Mo), aluminum (Al), it may be any one of chromium (Cr), gold (Au), titanium (Ti), nickel (Ni), neodymium (Nd), and copper (Cu), or their alloy and may have a multilayer thereof.

The second p-connection electrode 152a branched from the high potential power line 150a is connected to the second p-type layer 242 of the LED element 200 and the second p-electrode 252 being in contact with the second p-type layer 242. The second p-connection electrode 152a and the second p-electrode 252 are connected through the first bonding part 402.

The second n-connection electrode 122 connected to the second transistor T22 is connected to the second n-type layer 212 of the LED element 200 and the second n-electrode 262 being in contact with the second n-type layer 212. The second n-connection electrode 122 and the second n-electrode 262 are connected through the second bonding part 412. In addition, the second transistor T22 is connected to the common power line 140b through a contact electrode 142b.

The gate electrode 321G of the second transistor T22 is connected to one electrode 130a of the capacitor, and the one electrode 130a of the capacitor is connected to and in contact with the drain electrode 322D of the first transistor T12. The other electrode 130b of the capacitor overlaps the one electrode 130a of the capacitor and is connected to the common power line 140b.

The scan line 150b is connected to the gate electrode 322G of the first transistor T12, and the source electrode 322S of the first transistor T12 is connected to the data line 140a through the contact electrode 142a.

The connection relationship between the LED element 200 and the first transistor T12 and the second transistor T22 formed on the substrate 110 can be applied to the first transistor T11 and the second transistor T21 formed on the third insulating layer 105.

In an LED display device according to an embodiment of the present disclosure, the LED display device comprises a second pixel driving circuit on a substrate, an LED element attached to a region not overlapping the second pixel driving circuit and including a first LED element, a second LED element and a growth substrate, an element fixing layer surrounding the LED element, a first pixel driving circuit on the element fixing layer, and an element protecting layer on the first pixel driving circuit, wherein the first LED element is controlled by the first pixel driving circuit, and the second LED element is controlled by the second pixel driving circuit. Accordingly, the LED display device provides a dual emission spectrum, can realized high luminance and high definition, and can prevent a pixel defect.

According to another aspect of the present disclosure, the second LED element may be electrically connected to the second pixel driving circuit through a bonding part and a connection electrode.

According to another aspect of the present disclosure, the LED display device may further include a reflection layer between the LED element and the substrate, wherein the reflection layer may overlap the LED element. The reflection layer may contact the growth substrate. The second LED element may emit light toward the substrate, and the first LED element may emit light toward the element protecting layer.

According to another aspect of the present disclosure, the LED display device may further include a color conversion layer on the protection layer and a black matrix disposed on the same layer as the color conversion layer.

According to another aspect of the present disclosure, the first LED element and the second LED element may emit light of different colors.

According to another aspect of the present disclosure, the first pixel driving circuit and the second pixel driving circuit may have the same elements, and a connection relation between the same elements may be same.

According to another aspect of the present disclosure, the LED display device may further include a black matrix disposed on the same layer as the element fixing layer.

In an LED display device according to an embodiment of the present disclosure, the LED display device comprises a substrate divided into a display area, where a unit pixel is disposed, and a non-display area, a second pixel driving circuit on the substrate, a second connection electrode electrically connected to the second pixel driving circuit, a second LED element contacting the second connection electrode, a first LED element disposed on the second LED element, a first pixel driving circuit disposed on the first LED element, and a first connection electrode electrically connecting the first LED element and the first pixel driving circuit. Accordingly, the LED display device provides a dual emission spectrum, can realized high luminance and high definition, and can prevent a pixel defect.

According to another aspect of the present disclosure, the unit pixel may include a first sub-pixel and a second sub-pixel, each of the first sub-pixel and the second sub-pixel may include the first LED element and the second LED element, and the first sub-pixel may emit a green light and a blue light, and the second sub-pixel may emit a red light. The LED display device may be a top emission type, the first LED element included in the first sub-pixel may emit the green light, and the second LED element included in the first sub-pixel may emit the blue light. In addition, a structure of each of the first LED element and the second LED element included in the first sub-pixel may be different from a structure of each of the first LED element and the second LED element included in the second sub-pixel.

According to another aspect of the present disclosure, the first LED element and the second LED element may be attached to a same growth substrate.

According to another aspect of the present disclosure, the LED display device may further include a bonding part connecting the second LED element and the second connection electrode.

According to another aspect of the present disclosure, the unit pixel may include a plurality of sub-pixels, a black matrix may be disposed between adjacent sub-pixels of the plurality of sub-pixels, and the black matrix may be formed on the same layer as the first LED element and the second LED element.

Although the embodiments of the present invention have been described in more detail with reference to the accompanying drawings, the present invention is not necessarily limited to these embodiments, and various modifications may be made within the scope without departing from the technical spirit of the present invention. Accordingly, the embodiments disclosed in the present invention are not intended to limit the technical spirit of the present invention, but to explain, and the scope of the technical spirit of the present invention is not limited by these embodiments. Therefore, it should be understood that the embodiments described above are illustrative in all respects and not restrictive. The protection scope of the present invention should be construed by the claims, and all technical ideas within the scope equivalent thereto should be construed as being included in the scope of the present invention.

The invention claimed is:

1. An LED display device, comprising:
    a substrate;
    a second pixel driving circuit on the substrate;
    an LED element attached to a region of the substrate not overlapping the second pixel driving circuit, the LED element including a first LED element, a second LED element and a growth substrate;
    an element fixing layer surrounding the LED element;
    a first pixel driving circuit on the element fixing layer; and
    an element protecting layer on the first pixel driving circuit,
    wherein the first LED element is configured to be controlled by the first pixel driving circuit, and the second LED element is configured to be controlled by the second pixel driving circuit.

2. The LED display device of claim 1, wherein the second LED element is electrically connected to the second pixel driving circuit through a bonding part and a connection electrode.

3. The LED display device of claim 1, further comprising:
    a reflection layer between the LED element and the substrate,
    wherein the reflection layer overlaps the LED element.

4. The LED display device of claim 1, further comprising:
    a reflection layer on a same plane as the growth substrate.

5. The LED display device of claim 4, wherein the second LED element is configured to emit light toward the substrate, and the first LED element is configured to emit light toward the element protecting layer.

6. The LED display device of claim 1, further comprising:
    a color conversion layer on the element protecting layer.

7. The LED display device of claim 1, wherein the first LED element and the second LED element are configured to emit light of different colors.

8. The LED display device of claim 1, wherein the first pixel driving circuit and the second pixel driving circuit have the same elements, and a connection relation between the same elements is same.

9. The LED display device of claim 1, further comprising:
    a black matrix disposed on a same layer as the element fixing layer.

10. An LED display device, comprising:
    a substrate divided into a display area including a unit pixel disposed therein, and a non-display area;
    a second pixel driving circuit on the substrate;
    a second connection electrode electrically connected to the second pixel driving circuit;
    a second LED element contacting the second connection electrode;
    a first LED element disposed on the second LED element;
    a first pixel driving circuit disposed on the first LED element; and
    a first connection electrode electrically connecting the first LED element and the first pixel driving circuit.

11. The LED display device of claim 10, wherein the unit pixel includes a first sub-pixel and a second sub-pixel,
    wherein the first sub-pixel includes the first LED element and the second LED element,
    wherein the second sub-pixel includes a third LED element and a fourth LED element, and
    wherein the first sub-pixel emits a green light and a blue light, and the second sub-pixel emits a red light.

12. The LED display device of claim 11, wherein the LED display device is a top emission type, and
wherein the first LED element included in the first sub-pixel emits the green light, and the second LED element included in the first sub-pixel emits the blue light.

13. The LED display device of claim 11, wherein a structure of each of the first LED element and the second LED element included in the first sub-pixel is different from a structure of each of the third LED element and the fourth LED element included in the second sub-pixel.

14. The LED display device of claim 10, wherein the first LED element and the second LED element are attached to a same growth substrate.

15. The LED display device of claim 10, further comprising: a bonding part connecting the second LED element and the second connection electrode.

16. The LED display device of claim 10, wherein the unit pixel includes a plurality of sub-pixels,
wherein a black matrix is disposed between adjacent sub-pixels of the plurality of sub-pixels, and the black matrix is on a same layer as the first LED element and the second LED element.

* * * * *